United States Patent
May

(10) Patent No.: US 6,620,729 B1
(45) Date of Patent: Sep. 16, 2003

(54) ION BEAM DUAL DAMASCENE PROCESS

(75) Inventor: Charles E. May, Gresham, OR (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/952,343

(22) Filed: Sep. 14, 2001

(51) Int. Cl.[7] .................................... H01L 21/4763
(52) U.S. Cl. ................ 438/638; 438/637; 438/639; 438/524
(58) Field of Search ........................ 438/624, 638, 438/639, 637, 524

(56) References Cited

U.S. PATENT DOCUMENTS

| | | | | |
|---|---|---|---|---|
| 5,933,761 A | * | 8/1999 | Lee ............................ | 438/783 |
| 6,080,663 A | * | 6/2000 | Chen et al. ................. | 438/637 |
| 6,171,951 B1 | * | 1/2001 | Lee et al. ................... | 438/640 |
| 6,287,961 B1 | * | 9/2001 | Liu et al. .................... | 438/638 |
| 6,326,300 B1 | * | 12/2001 | Liu et al. .................... | 438/638 |

* cited by examiner

Primary Examiner—Trung Dang
(74) Attorney, Agent, or Firm—Luedeka, Neely & Graham

(57) ABSTRACT

A dual-damascene process for forming an integrated circuit structure is described. The process includes forming a trench in a dielectric substrate, and forming a via mask layer over the dielectric substrate and the trench. An aperture is formed in the via mask layer overlying the trench, thereby exposing a portion of the underlying dielectric substrate. The exposed portion of the dielectric substrate is subjected to an ion beam to damage the exposed dielectric material. The damaged portion of the dielectric substrate is then removed, such as by etching, thereby forming a via cavity below the trench in the dielectric substrate. Generally, the damaged portion of the dielectric substrate etches at a faster rate than do adjacent non-damaged regions. With a faster etch, there is practically no outward spreading of the via cavity as the etch proceeds downward through the dielectric substrate, thereby forming a via cavity wall that is very nearly vertical. More precise control of via cavity geometry provides for more precise alignment of the via cavity with underlying conductors in the integrated circuit structure.

17 Claims, 3 Drawing Sheets

ION BEAM DUAL DAMASCENE PROCESS

FIELD

This invention relates to the field of integrated circuit fabrication. More particularly the invention relates to forming vias in integrated circuit structures as part of a dual-damascene fabrication process.

BACKGROUND

Increasingly, dual-damascene processing is being used to form copper interconnects in semiconductor circuits. Generally, there are two types of dual-damascene processes: trench-first and via-first. In via-first processing, a via cavity is etched completely down to an underlying conductor, and is then filled with material to protect the via cavity during a subsequent trench etch process. In trench-first processing, the trench is patterned and etched first, and then the via cavity is patterned and etched within the trench.

Trench-first processing has had several drawbacks, including difficulty in aligning and etching the via cavity within the trench. The alignment problem is exacerbated by the slope which is usually present in the sidewalls of a via cavity formed according to a traditional etching process.

What is needed, therefore, is a more directional process for forming a via cavity in a trench-first dual-damascene process, thereby improving the alignment of the via cavity with an underlying conductor.

SUMMARY

The above and other needs are met by a process for forming an integrated circuit structure. The process includes forming a trench in a dielectric substrate, and forming a via mask layer over the dielectric substrate and the trench. An aperture is formed in the via mask layer overlying the trench, thereby exposing a portion of the underlying dielectric substrate. The process includes subjecting the exposed portion of the dielectric substrate to an ion beam to damage the exposed dielectric material. The portion of the dielectric substrate that was subjected to the ion beam is then removed, such as by etching, thereby forming a via cavity in the dielectric substrate.

Generally, the damaged portions of the dielectric substrate etch at a faster rate than do adjacent non-damaged regions. With a faster etch, there is practically no outward spreading of the via cavity as the etch proceeds downward through the dielectric substrate, thereby forming a via cavity wall that is very nearly vertical. More precise control of via cavity geometry provides for more precise alignment of the via cavity with underlying conductors in the integrated circuit structure.

In various preferred embodiments, after removing the via mask layer, metal is deposited over the dielectric substrate, thereby substantially filling the via cavity and the trench with the metal. The metal is then selectively removed from the dielectric substrate, such as by planarization, while leaving the metal in the trench and the via cavity.

BRIEF DESCRIPTION OF THE DRAWINGS

Further advantages of the invention are apparent by reference to the detailed description when considered in conjunction with the figures, which are not to scale so as to more clearly show the details, wherein like reference numbers indicate like elements throughout the several views, and wherein.

DETAILED DESCRIPTION

Referring now to FIGS. 1A–F and 2, there is generally depicted steps of an integrated circuit fabrication process according to a preferred embodiment of the invention. Described below are the major steps in the process according to the invention. Other steps not described in detail herein may also be required to complete the processing, such as photoresist removal and rinsing steps.

Figure 1A:
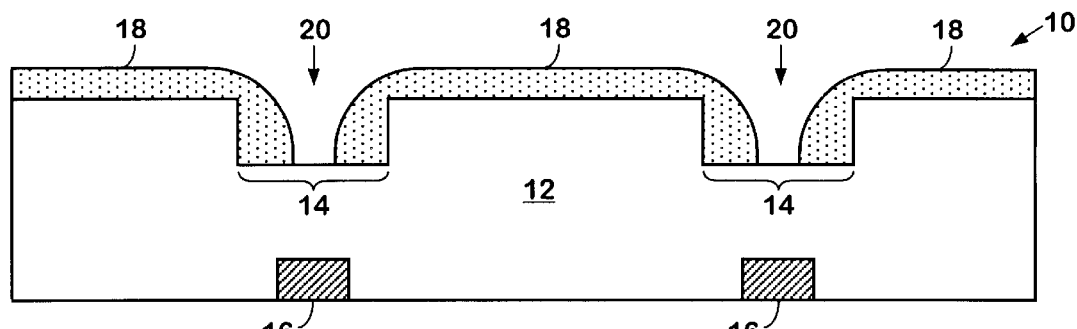
FIGS. 1A–1F depict formation of metal interconnects in an integrated circuit structure using a dual-damascene process according to a preferred embodiment of the invention.

As depicted in FIG. 1A, the process of the present invention begins with an integrated circuit structure 10, such as may be one layer of a multi-layer interconnect circuit. The structure 10 includes a semiconductor substrate 12 formed from silicon dioxide or other low-k dielectric material, or from a combination of layers of silicon dioxide and other dielectric materials. For example, a layer of silicon nitride may be disposed in the substrate 12, such as to provide an etch-stop layer to aide in formation of structures, such as trenches, within the substrate 12. However, whether an etch-stop or other type of dielectric layer may be present in the substrate 12 in no way limits the scope of the present invention.

It is further appreciated that the substrate 12 may represent only a portion of the complete structure that may comprise the substrate 12. For example, additional layers may be present below, above, or within those layers as depicted in FIG. 1A, as briefly mentioned above. In addition, the present invention is not limited to a substrate 12 formed of silicon dioxide, but is also applicable to other materials that are compatible with the functions, materials, and processes as described and contemplated herein.

In a preferred embodiment of the invention, trenches 14 are formed in the substrate 12, preferably by a patterning and etching process (step 100 in FIG. 2), such as is well known to those skilled in the art of semiconductor manufacturing. However, it will be appreciated that the process used in forming the trenches 14 is not critical to the present invention. The trenches 14 provide cavities for inlaid conductive structures formed in process steps described hereinafter.

Below the trenches 14 are conductors 16 which have been formed during prior processing of the substrate 12. Generally, the conductors 16 are formed from metal, such as aluminum or copper, according to well-known deposition methods.

As shown in FIG. 1A, photoresist is applied over the substrate 12 (step 102), and the photoresist is patterned (step 104) to form a via mask layer 18. Preferably, the via mask layer 18 is patterned according to standard photolithography processing to form apertures 20 in the layer 18, thereby exposing portions of the substrate 12 at the bottom of the trenches 14.

Figure 1B:
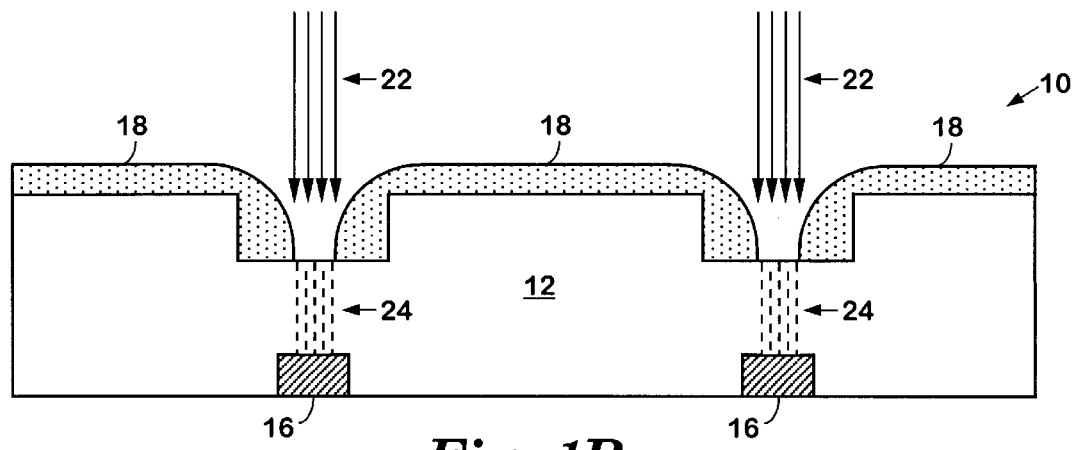

In a typical dual-damascene process, the next step would be to expose the structure 10 depicted in FIG. 1A to an etchant to etch through the substrate 12 exposed in the trenches 14, thereby forming via cavities down to the underlying conductors 16. However, according to the present invention, an additional process step is introduced to significantly improve the subsequent via etching process. As shown in FIG. 1B, the substrate 12 at the bottom of the trenches 14 is subjected to an ion beam 22, which is preferably composed of ions of a material that does not chemically react with the substrate 12, such as argon or nitrogen (step 106). As depicted in FIG. 1B, the ion beam 22 has sufficient energy to cause fractures in the substrate 12 in regions 24 below the trenches 14. By precise control of the alignment and diameter of the ion beam 22 through the aperture 20, the bombardment of ions preferably mechanically damages the substrate 12 only within the regions 24 above the conductors 16.

The damage within the regions 24 is also preferably controlled by selection of the weight of the species that is fed into the ion beam 22. Thus, heavier species will generally tend to cause more damage, and lighter species will generally tend to case less damage. Further, by adjusting the power of the ion beam 22, either a greater or lesser amount of damage to the substrate 12 can be inflicted. By varying these and other related parameters, both the width and the depth of the regions 24 can be tailored.

Figure 1C:
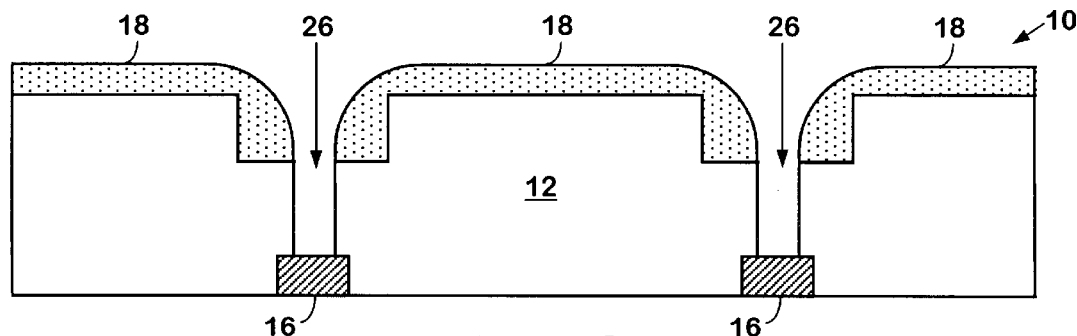

After exposure to the ion beam 22, the structure depicted in FIG. 1B is exposed to an etchant to remove the substrate material within the regions 24, thereby forming via cavities 26 as shown in FIG. 1C (step 108). Generally, the etchant penetrates the fractured substrate material within the damaged regions 24 at a faster rate than it does adjacent non-damaged regions of the substrate 12. In this manner, the etching of the via cavities 26 may be accomplished in significantly less time than was possible in prior processes. With the faster etch provided by the present invention, there is preferably little if any outward spreading of the via cavities 26 as the etch proceeds downward through the substrate 12. Thus, as depicted in FIG. 1C, the walls of the via cavities 26 formed according to the invention tend to be nearly vertical. With the more precise control of via cavity geometry provided by the present invention, alignment of the via cavities 26 with the underlying conductors 16 tends to be more precise than was previously possible.

Figure 1D:
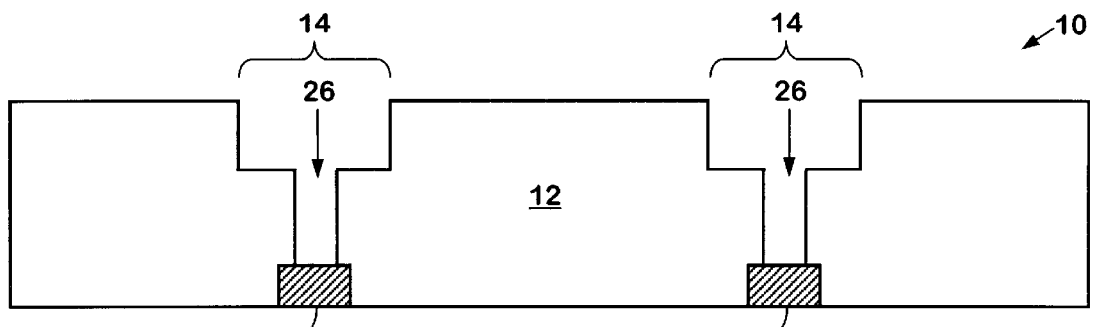

As shown in FIG. 1D, the via mask layer 18 is removed, thereby exposing the trenches 14 and the upper surface of the substrate 12 (step 110).

Figure 1E:
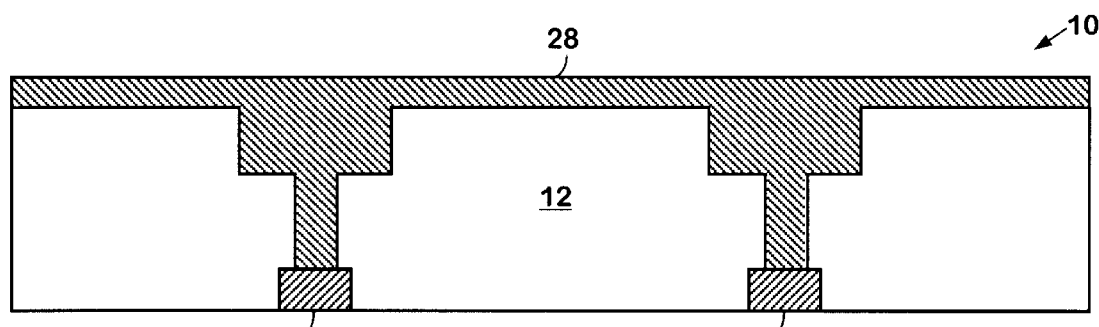

As depicted in FIG. 1E, a metal, such as copper or aluminum, is applied to the structure 10 to form a metal layer 28 (step 112). The metal layer 28, which is preferably copper, may be formed by electroplating, chemical vapor deposition, or sputtering. Thus, it is appreciated that the scope of the invention is not limited by the type of metal used in the layer 28, or its method of application.

Figure 1F:
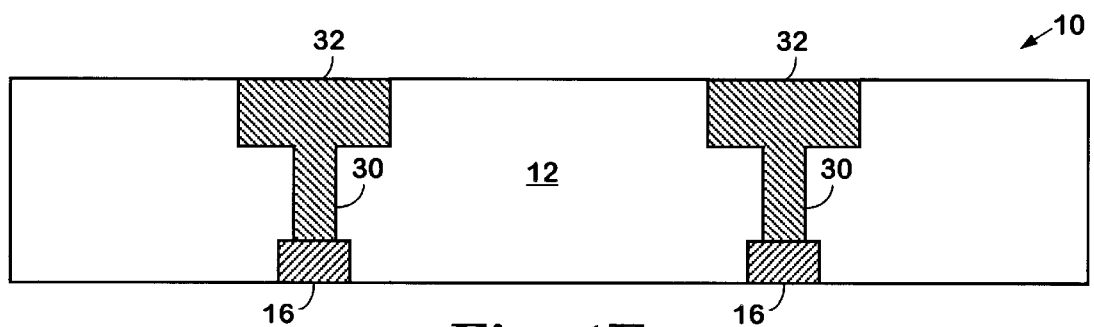
Figure 2:
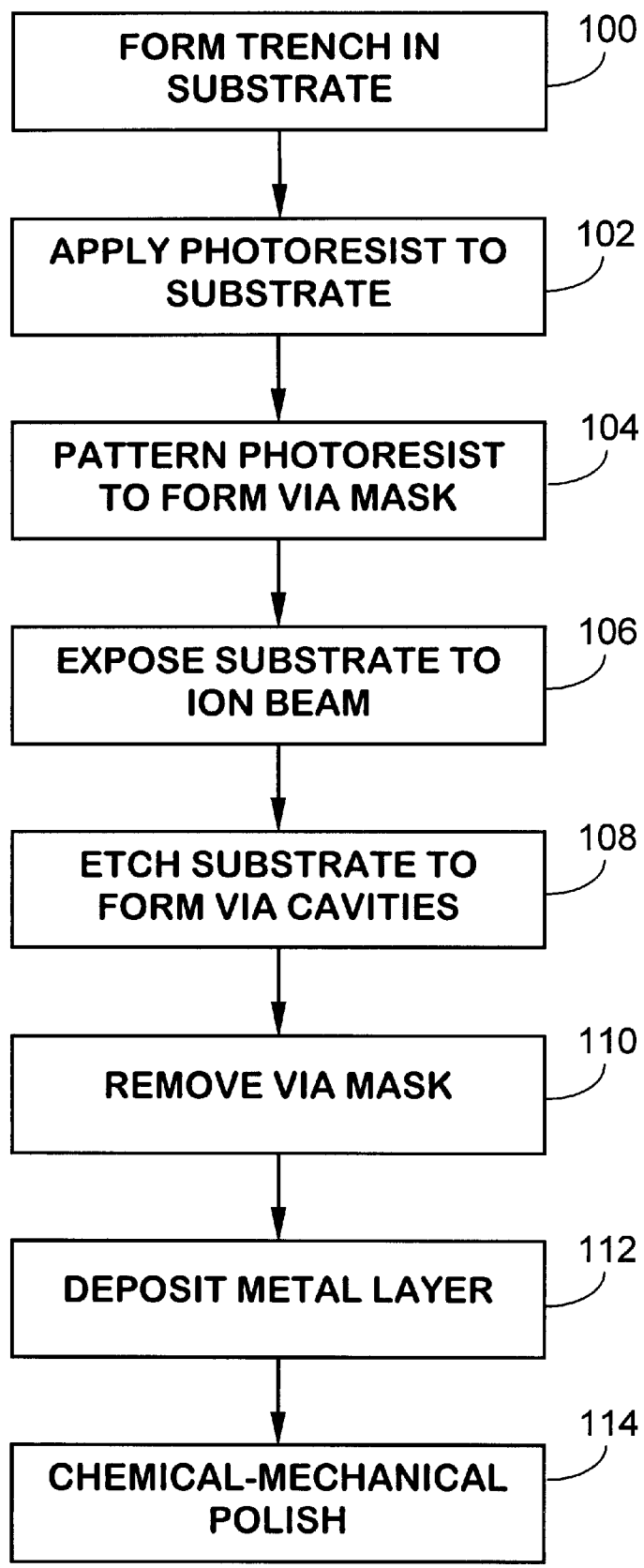
FIG. 2 depicts a dual-damascene process flow according to a preferred embodiment of the invention.

In the preferred embodiment of the invention, the structure 10 is planarized, such as by chemical-mechanical polishing (step 114), to provide the structure 10 as depicted in FIG. 1F. After planarization, the portions of the metal layer 28 disposed in the via cavities 26 form vias 30, and the portions disposed in the trenches 14 form trench electrodes 32. The planarization step preferably removes any metal that has bridged the substrate 12 between the trench electrodes 32, thereby electrically isolating the trench electrodes 32.

The foregoing description of preferred embodiments for this invention have been presented for purposes of illustration and description. They are not intended to be exhaustive or to limit the invention to the precise form disclosed. Obvious modifications or variations are possible in light of the above teachings. The embodiments are chosen and described in an effort to provide the best illustrations of the principles of the invention and its practical application, and to thereby enable one of ordinary skill in the art to utilize the invention in various embodiments and with various modifications as is suited to the particular use contemplated. All such modifications and variations are within the scope of the invention as determined by the appended claims when interpreted in accordance with the breadth to which they are fairly, legally, and equitably entitled.

What is claimed is:

1. A process for forming an integrated circuit structure, comprising:
    (a) forming a trench in a substrate;
    (b) forming a via mask layer over the substrate and the trench;
    (c) forming in the via mask layer an aperture overlying the trench, thereby exposing a portion of the underlying substrate;
    (d) subjecting the exposed portion of the substrate to an ion beam; and
    (e) etching the portion of the substrate that was subjected to the ion beam, thereby forming a via cavity in the substrate.

2. The process of claim 1 wherein the substrate further comprises a dielectric substrate.

3. The process of claim 1 wherein step (a) further comprises patterning and etching the substrate.

4. The process of claim 1 wherein step (b) further comprises applying a photoresist over the substrate and the trench.

5. The process of claim 3 wherein step (c) further comprises patterning the photoresist to form the aperture overlying the trench.

6. The process of claim 1 wherein step (d) further comprises damaging the substrate underlying the aperture in the via mask layer to make damaged regions in the substrate that are more susceptible to the etch of step (e).

7. The process of claim 1 wherein the ion beam is of a material that is substantially non reactive with the substrate.

8. The process of claim 1 wherein step (e) further comprises wet etching through the substrate to form the via cavity therein.

9. The process of claim 1 further comprising:
    (f) removing the via mask layer;
    (g) depositing metal over the substrate, thereby substantially filling the via cavity and the trench with the metal; and
    (h) selectively removing the metal from the substrate, while leaving the metal in the trench and the via cavity.

10. The process of claim 9 wherein step (g) further comprises depositing copper in the via cavity and the trench by electroplating.

11. The process of claim 9 wherein step (h) further comprises removing the metal from the substrate by chemical mechanical polishing.

12. In a trench-first dual damascene process, a method for forming a via cavity underlying a trench in a dielectric material, comprising:
    (a) forming a via mask layer over the trench;
    (b) forming an aperture in the via mask layer, thereby exposing a portion of the dielectric material underlying the trench;
    (c) subjecting the exposed portion of the dielectric material to an ion beam; and
    (d) removing the portion of the dielectric material that was subjected to the ion beam, thereby forming the via cavity in the dielectric material.

13. The process of claim 12 wherein step (a) further comprises applying a photoresist over the dielectric material and the trench.

14. The process of claim 12 wherein step (b) further comprises patterning the photoresist to form the aperture in the via mask layer.

15. The process of claim 12 wherein step (c) further comprises damaging the dielectric material underlying the aperture in the via mask layer.

16. The process of claim 12 wherein step (d) further comprises etching through the dielectric material to form the via cavity therein.

17. A process for forming an integrated circuit structure, comprising:
   (a) patterning and etching a dielectric substrate to forming a trench therein;
   (b) applying a photoresist over the dielectric substrate and the trench;
   (c) patterning the photoresist to form an aperture therein overlying the trench, thereby exposing a portion of the underlying dielectric substrate;
   (d) subjecting the exposed portion of the dielectric substrate to an ion beam; and
   (e) etching through the portion of the dielectric substrate that was subjected to the ion beam, thereby forming a via cavity in the dielectric substrate underlying the trench.

* * * * *